(12) United States Patent  
Asnaashari et al.

(10) Patent No.: US 8,392,687 B2
(45) Date of Patent: Mar. 5, 2013

(54) SOLID STATE MEMORY FORMATTING

(75) Inventors: Mehdi Asnaashari, Danville, CA (US); William E. Benson, San Mateo, CA (US)

(73) Assignee: Micron Technology, Inc., Boise, ID (US)

( * ) Notice: Subject to any disclaimer, the term of this patent is extended or adjusted under 35 U.S.C. 154(b) by 1080 days.

(21) Appl. No.: 12/356,725

(22) Filed: Jan. 21, 2009

(65) Prior Publication Data

US 2010/0185802 A1      Jul. 22, 2010

(51) Int. Cl.
G06F 12/00      (2006.01)
(52) U.S. Cl. .................. 711/170; 711/E12.007
(58) Field of Classification Search .................. 711/170, 711/E12.007
See application file for complete search history.

(56) References Cited

U.S. PATENT DOCUMENTS

| | | | |
|---|---|---|---|
| 5,799,168 | A | 8/1998 | Ban |
| 7,085,914 | B1 | 8/2006 | Gschwind |
| 7,383,375 | B2 | 6/2008 | Sinclair |
| 2006/0004969 | A1 | 1/2006 | Suda |
| 2007/0234297 | A1 | 10/2007 | Zorn et al. |
| 2008/0002467 | A1 | 1/2008 | Tsuji |
| 2009/0172256 | A1* | 7/2009 | Chu et al. ............... 711/103 |

OTHER PUBLICATIONS http://web.archive.org/web/20071016170902/http://www.gnu.org/software/libc/manual/html_node/Resizing-the-Data-Segment.html capture of webpage http://www.gnu.org/software/libc/manual/html_node/Resizing-the-Data-Segment.html by WaybackMachine on Oct. 16, 2007.*
International Search Report and Written Opinion for related PCT Application PCT/US2010/000099, mailed Aug. 24, 2010 (9 pgs.).
European Search Report for related EP Application No. 10738833.2, mailed Jul. 20, 2012, (6 pages).

* cited by examiner

*Primary Examiner* — Edward Dudek, Jr.
*Assistant Examiner* — John P Fishburn
(74) *Attorney, Agent, or Firm* — Brooks, Cameron & Huebsch, PLLC

(57) ABSTRACT

The present disclosure includes methods and devices for solid state drive formatting. One device embodiment includes control circuitry coupled to a number of memory arrays, wherein each memory array has multiple physical blocks of memory cells. The memory arrays are formatted by the control circuitry that is configured to write system data to the number of memory arrays, where the system data ends at a physical block boundary; and write user data to the number of memory arrays, where the user data starts at a physical block boundary.

11 Claims, 5 Drawing Sheets

SOLID STATE MEMORY FORMATTING

TECHNICAL FIELD

The present disclosure relates generally to semiconductor memory devices, methods, and systems, and more particularly, to solid state drive formatting.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored information when not powered and can include NAND flash memory, NOR flash memory, read only memory (ROM), Electrically Erasable Programmable ROM (EEPROM), Erasable Programmable ROM (EPROM), and phase change random access memory (PCRAM), among others.

Memory devices can be combined together to form a solid state drive (SSD). A solid state drive can include non-volatile memory, e.g., NAND flash memory and NOR flash memory, and/or can include volatile memory, e.g., DRAM and SRAM, among various other types of non-volatile and volatile memory.

An SSD can be used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may ameliorate seek time, latency, and other electromechanical delays associated with magnetic disk drives. SSD manufacturers can use non-volatile flash memory to create flash SSDs that may not use an internal battery supply, thus allowing the drive to be more versatile and compact.

An SSD can include a number of memory devices, e.g., a number of memory chips (as used herein, "a number of" something can refer to one or more of such things, e.g., a number of memory devices can refer to one or more memory devices). As one of ordinary skill in the art will appreciate, a memory chip can include a number of dies. Each die can include a number of memory arrays and peripheral circuitry thereon. The memory arrays can include a number of memory cells organized into a number of physical blocks, and the physical blocks can be organized into a number of pages.

For some storage applications, SSDs can be used as a replacement or compliment to hard (disk) drives. In these instances, SSDs are placed in an environment that was designed to accommodate a hard drive's functions. Due to the differences in granularity or quantization of the smallest erasable unit between SSDs and hard drives (e.g., a 512 byte sector for hard drives versus a 128 k or 256 k block in SSDs), an SSD that is used as a replacement for or compliment to a hard drive in a computing device may not operate at peak performance levels.

DETAILED DESCRIPTION

Figure 1:
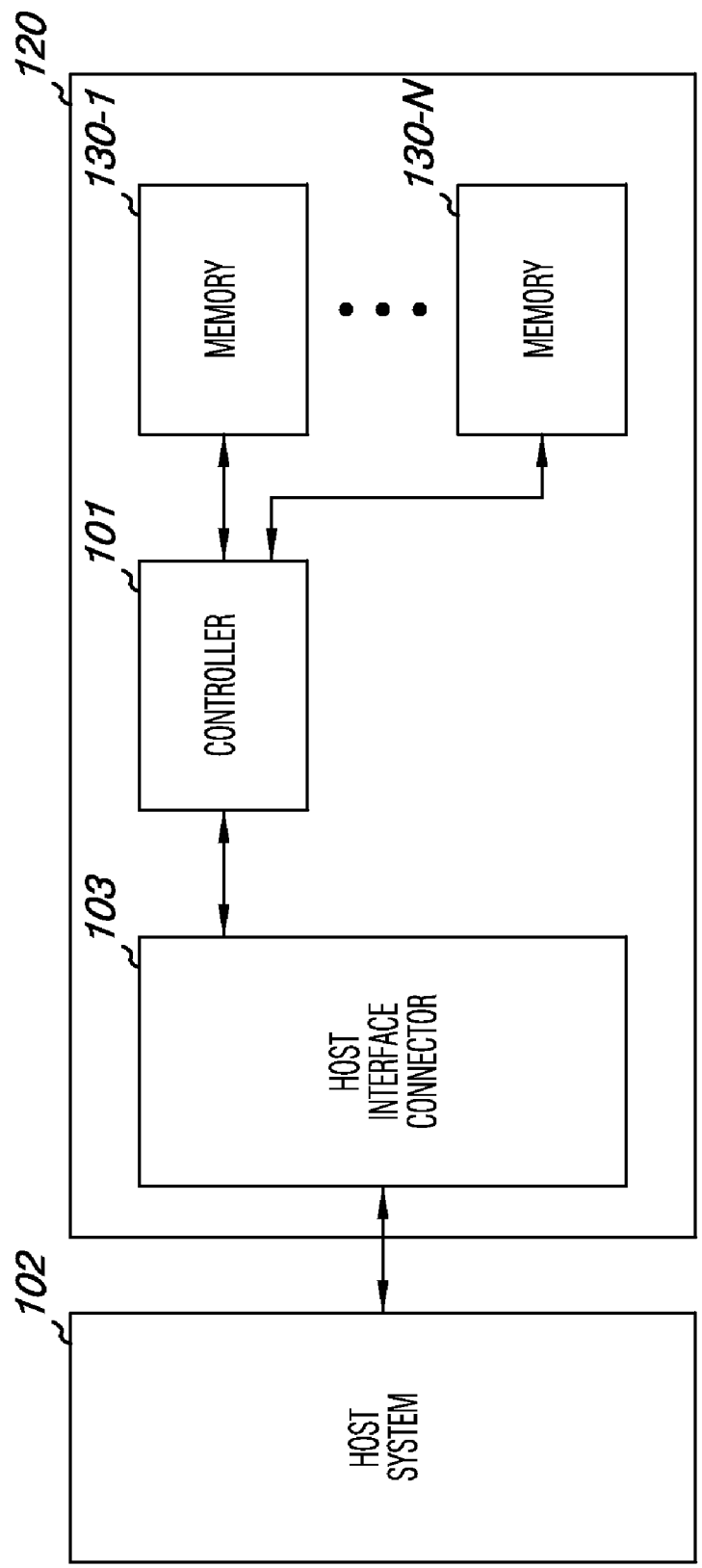
FIG. 1 is a functional block diagram of an electronic memory system that can be operated in accordance with one or more embodiments of the present disclosure.

The present disclosure includes methods and devices for solid state drive formatting. One device embodiment includes control circuitry coupled to a number of memory arrays, wherein each memory array has multiple physical blocks of memory cells. The memory arrays can be formatted by the control circuitry that is configured to write system data to the number of memory arrays such that the system data ends at a physical block boundary and to write user data to the number of memory arrays such that the user data starts at a physical block boundary.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "M," "K," and "S," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a functional block diagram of an electronic memory system 120 that can be operated in accordance with one or more embodiments of the present disclosure. In the embodiment illustrated in FIG. 1, the memory system 120 can be a solid state drive (SSD), for example. As illustrated in FIG. 1, the system 120 can include a memory controller 101, a host interface connector 103, and a number of memory arrays 130-1, ..., 130-N, e.g., a number of solid state memory arrays, such as a number of flash arrays, for instance.

The interface 103 can be used to communicate information between the memory system 120 and another device such as a host system 102. Host system 102 can include a memory access device, e.g., a processor. One of ordinary skill in the art will appreciate that "a processor" can intend one or more processors, such as a parallel processing system, coprocessors, etc. Examples of host systems include laptop computers, personal computers, digital cameras, digital recording and playback devices, PDAs, memory card readers, interface hubs, and the like. For one or more embodiments, the interface 103 can be in the form of a standardized interface. For example, the host interface connector 103 can be a serial advanced technology attachment (SATA), peripheral component interconnect express (PCIe), or a universal serial bus (USB), among other connectors and interfaces. In general, however, interface 103 can provide an interface for passing control, address, data, and other signals between the memory system 120 and a host system 102 having compatible receptors for the interface 103.

The memory controller 101 can communicate with the arrays 130-1, . . . , 130-N to sense, program, and erase data, among other operations. Memory controller 101 can have circuitry that may be one or more integrated circuits and/or discrete components. For one or more embodiments, the circuitry in memory controller 101 may include control circuitry for controlling access across a number of memory arrays and/or for providing a translation layer between an external host and the memory system 120. Thus, a memory controller could selectively couple an I/O connection (not shown in FIG. 1) of a memory array to receive the appropriate signal at the appropriate I/O connection at the appropriate time. Similarly, the communication protocol between a host 102 and the memory system 120 may be different than what is required for access of a memory array, such as arrays 130-1 to 130-N. Memory controller 101 could then translate the commands received from a host, e.g., 102, into the appropriate commands to achieve the desired access to a memory array.

Memory arrays 130-1, . . . , 130-N can be arrays of non-volatile memory cells, which can be flash memory cells with a NAND architecture, for example. In a NAND architecture, the control gates of memory cells of a "row" can be coupled with a word line, while the drain regions of the memory cells of a "column" can be coupled to bit lines. The source regions of the memory cells can be coupled to source lines. As will be appreciated by those of ordinary skill in the art, the manner of connection of the memory cells to the bit lines and source lines depends on whether the array is a NAND architecture, a NOR architecture, an AND architecture, or some other memory array architecture.

The embodiment of FIG. 1 can include additional circuitry that is not illustrated so as not to obscure embodiments of the present disclosure. For example, the memory system 120 can include address circuitry to latch address signals provided over I/O connections through I/O circuitry. Address signals can be received and decoded by a row decoder and a column decoder to access the memory 130-1, . . . , 130-N. It will be appreciated by those skilled in the art that the number of address input connections depends on the density and architecture of the memory 130-1, . . . , 130-N, and that the number of addresses increases with both increased numbers of memory cells and increased numbers of memory blocks and arrays.

Figure 2:
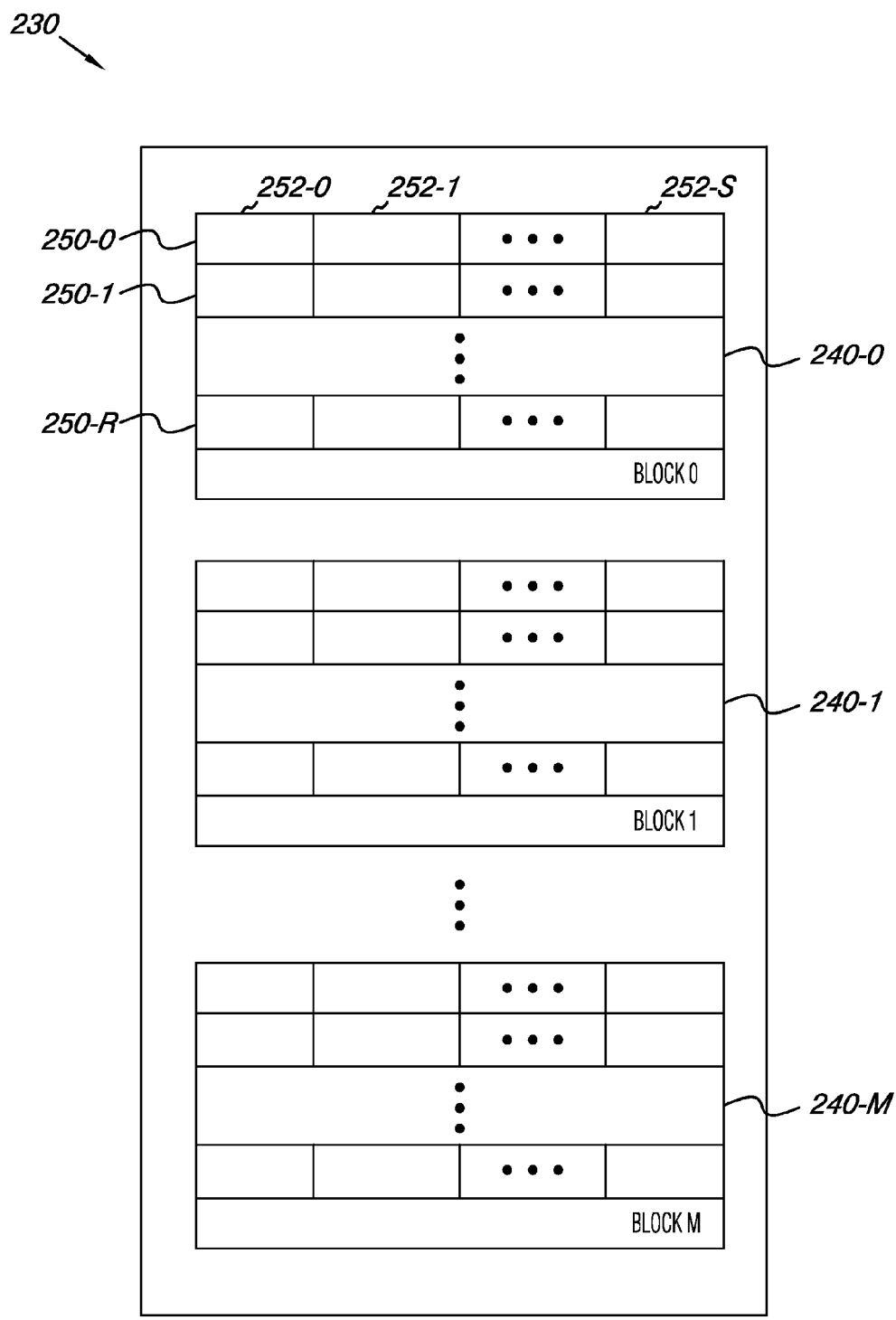
FIG. 2 illustrates a diagram of a portion of a memory array in accordance with one or more embodiments of the present disclosure.

FIG. 2 illustrates a diagram of a portion of a memory array 230 in accordance with one or more embodiments of the present disclosure. Although not shown in FIG. 2, one of ordinary skill in the art will appreciate that the memory array 230 can be located on a particular semiconductor die along with various peripheral circuitry associated with the operation thereof.

As shown in FIG. 2, array 230 has a number of physical blocks 240-0 (BLOCK 0), 240-1 (BLOCK 1), . . . , 240-M (BLOCK M) of memory cells. In the example shown in FIG. 1, the indicator "M" is used to indicate that the array 230 can include a number of physical blocks. The memory cells can be single level cells and/or multilevel cells. As an example, the number of physical blocks in array 230 may be 128 blocks, 512 blocks, or 1,024 blocks, but embodiments are not limited to a particular multiple of 128 or to any particular number of physical blocks in an array 230. Further, embodiments are not limited to the type of memory used in the array, e.g., non-volatile, volatile, etc. In the embodiment illustrated in FIG. 2, the memory array 230 can be, for example, a NAND flash memory array 230.

In this example, each physical block 240-0, 240-1, . . . , 240-M includes memory cells which can be erased together as a unit, e.g., the cells in each physical block can be erased in a substantially simultaneous manner. For instance, the cells in each physical block can be erased together in a single operation. Each physical block, e.g., 240-0, 240-1, . . . , 240-M, contains a number of physical rows, e.g., 250-0, 250-1, . . . , 250-R, of memory cells coupled to an access line, e.g., a word line. The indicator "R" is used to indicate that a physical block, e.g., 240-0, 240-1, . . . , 240-M, can include a number of rows. In some embodiments, the number of rows, e.g., word lines, in each physical block can be 32, but embodiments are not limited to a particular number of rows 250-0, 250-1, . . . , 250-R per physical block.

As one of ordinary skill in the art will appreciate, each row 250-0, 250-1, . . . , 250-R can store one or more pages of data. A page refers to a unit of programming and/or reading, e.g., a number of cells that are programmed and/or read together or as a functional group of memory cells. In the embodiment shown in FIG. 1, each row 250-0, 250-1, . . . , 250-R stores one page of data. However, embodiments of the present disclosure are not so limited. For instance, in some embodiments of the present disclosure, each row can store multiple pages of data. For example, each cell in a row can contribute a bit towards an upper page of data, and can contribute a bit towards a lower page of data. In one or more embodiments, a memory array can include multiple physical blocks of memory cells and each physical block can be organized into multiple pages.

In one or more embodiments of the present disclosure, and as shown in FIG. 2, a row, such as row 250-0, can store data in accordance with a number of physical sectors 252-0, 252-1, . . . , 252-S. The indicator "S" is used to indicate that a row, e.g., 250-0, 250-1, . . . , 250-R, can include a number of physical sectors. Each physical sector 252-0, 252-1, . . . , 252-S can store data corresponding to a logical sector and can include overhead information, such as error correction code (ECC) information and logical block address (LBA) information, as well as user data. As one of ordinary skill in the art will appreciate, logical block addressing is a scheme often used by a host for identifying a logical sector of information. As an example, a logical sector of data can be a number of bytes of data, e.g., 256 bytes, 512 bytes, or 1,024 bytes. Embodiments are not limited to these examples.

It is noted that other configurations for the physical blocks 240-0, 240-1, . . . , 240-M, rows 250-0, 250-1, . . . , 250-R, sectors 252-0, 252-1, . . . , 252-S, and pages are possible. For example, the rows 250-0, 250-1, . . . , 250-R of the physical blocks 240-0, 240-1, . . . , 240-M can each store data corresponding to a single logical sector which can include, for example, more or less than 512 bytes of data.

Figure 3:
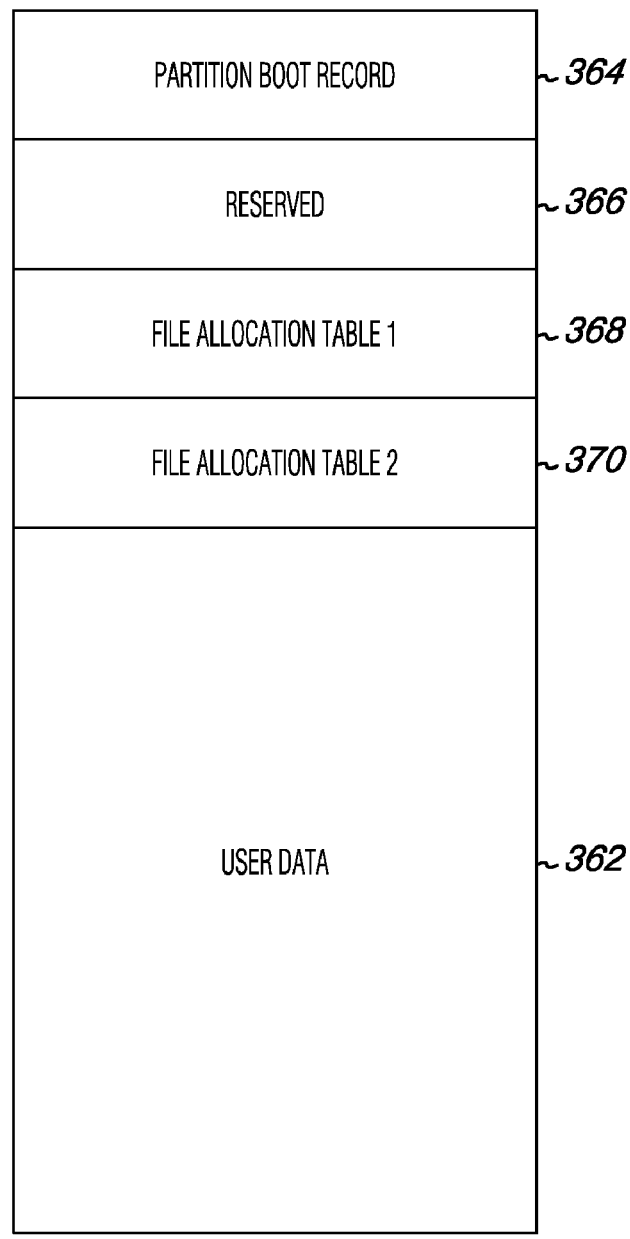
FIG. 3 illustrates a diagram of a file system for a number of memory arrays in accordance with one or more embodiments of the present disclosure.

FIG. 3 illustrates a diagram of a file system for a number of memory arrays 330 in accordance with one or more embodiments of the present disclosure. In one or more embodiments, a number of physical blocks can be used to store system data and a number of physical blocks can be used to store user data. In the embodiment illustrated in FIG. 3, the system data can include a partition boot record (PBR) 364, reserved data 366, a first file allocation table 368, and a second file allocation table 370. System data can include data that relates to the structure and operation of file system for a number of memory arrays 330. As an example, file allocation tables, e.g., 368 and 370, can contain file allocation data that centralizes the information about which areas of memory arrays, e.g., 330, have data stored, are free or possibly unusable, and where data is stored in the memory array. In various embodiments, two file allocation tables can be used with one of the file allocation tables acting as a backup for a potential failure of one of the file allocation tables. The reserved data 366, for example, can include data containing information about the memory arrays and can be used by the memory arrays to enable the operation of the memory arrays.

In the embodiment illustrated in FIG. 3, user data can be, e.g., data received from a host device, such as host 102 shown in FIG. 1. The user data 362 can be written, read, and erased a number of times.

In one or more embodiments, a host device, such as host 102, and/or control circuitry in a controller, such as controller 101, for example, can communicate commands to a memory array such that data is written to the memory array in a desired manner. The commands from the host device and/or control circuitry can be configured to write data at the beginning of a page for the data that is associated with each command. Also, in one or more embodiments, commands from the host device and/or control circuitry can be configured to write data at a first page of a physical block, e.g., physical block boundary, when writing data to an erased block. In one or more embodiments, a formatted memory device can use the command from the host device and/or control circuitry to write data to the first memory cell of a page, e.g., page boundary, of a memory array and/or by writing data to the beginning of an empty, e.g., erased, page.

In one or more embodiments, formatting the memory arrays can include writing PBR data, where the PBR can allocate space in the memory arrays for the system and user data. The PBR data structures can be constructed and/or configured such that user and system data starts at the beginning of a physical block. When a write command is received by the memory arrays, the PBR causes the command to write data at the next available location in the memory array corresponding to the modulus, which is calculated to ensure each modulus increment in the memory array is at the beginning of a physical block and/or page.

In one or more embodiments, formatting includes using system data and/or metadata for the memory arrays to determine the location of the system data and user data in the memory arrays. In one or more embodiments, system data and/or metadata can include physical parameters, such as memory array size, page size, block size, file system type, media type, and memory cell type, among other parameters. The storage space, e.g., sectors, that is available to store user data can be quantized to allocation units. An allocation unit, e.g., cluster, can include a number of sectors. The number of sectors in an allocation unit can be specified by the system data and/or metadata for the memory arrays. For example, a sector in the memory arrays can be comprised of 512 bytes and an allocation unit can have 8 sectors resulting in an allocation unit with 4096 bytes. Therefore, in this example, successive allocation units each containing 4096 bytes can be addressed by the host by adding 8 to the previous allocation unit's logical address.

In one or more embodiments, the minimum quantity of sectors for a write operation, which is the number of sectors in a page, e.g. page size, and/or the minimum quantity of pages for an erase operation, which is the number of pages in a block, e.g., block size, can be used along with the allocation unit, as defined by the memory array metadata and/or system data, to determine the modulus for the memory arrays. The modulus can be used to format the memory array to determine the starting location for the components of the system data and the user data.

For example, an SSD can have 4, 8, or 16 sectors in a page, where a sector can be 512 bytes, and an SSD can have 128, 256, or 512 pages per physical block, therefore physical block sizes are 131072 bytes, 262144 bytes, and 524288 bytes. Embodiments of the present disclosure are not limited to this example and sectors, pages, and physical blocks can be comprised of any number of bytes.

In one or more embodiments, formatting the memory arrays can include using the page size, block size, and allocation unit to determine the modulus to use when determining the starting location for the components of the system data and the user data. During formatting the host can use knowledge of the SSD's organization of the memory arrays, in particular those requirements that affect the minimum size of a write or erase operation, as well as the host's knowledge of metadata structures of the chosen file system, such as the size of FAT1 and FAT2, for example, employed to determine the format, e.g., the location of the components of the system data and the user data, for the memory arrays. For example, the starting location for the PBR, reserved data, FAT1, FAT2, and user data can be defined using the modulus and the metadata and/or system data for the memory arrays. This formatting will align each of these portions at the beginning of a physical block.

Once the device has been formatted, host requests to read or write user data will be aligned with the modulus and the allocation unit. For example, FAT type file systems will most commonly organize the allocation units into groups of 512 byte sectors in increasing powers of 2, starting with a 1:1 allocation unit to logical block mapping for small capacity devices, up to 64 sectors per allocation unit. For example, in the case of 64 sectors per allocation unit, the accesses by host will be seen to be at addresses that are modulus 64, with fixed offset added to the address that depends on the size of the preceding or interlaced system, e.g., metadata, entries.

When the SSD receives a write command that is not aligned to a page boundary, those sectors in the page that precede the sector indicated by the starting logical block of the write command are copied to the page being accessed by the write command, resulting in extra overhead, and also more writes to the memory arrays, as the old location of those sectors will also need to be erased. A formatted SSD can increase performance and prolongs the life of the SSD by minimizing the extra writes incurred by a non-aligned format.

In one or more embodiments, a format which results in the least amount of extra overhead and/or extra read/write operations that the device must perform when new data is written by host is desired.

In one or more embodiments, a host that has no knowledge of the SSD's page size and/or erase block size, e.g. metadata and/or system data, can format the memory arrays based on the fact that memory array capacities can be quantized to powers of 2. Memory arrays can be formatted by aligning the logical addresses of the components of the system data and the user data, e.g., allocation units, based on powers of 2. In one or more embodiments that align system data and allocation units based on powers of 2, the memory array translation of the logical address received in a host command cannot add an additional offset to the received logical address, or if an offset is used, the additional offset must also be a power of 2.

Formatting memory arrays by writing data in accordance with embodiments of the present disclosure can reduce the amount of operating overhead associated with writing new data on the memory arrays. Overhead can refer to a number of additional memory cells that have to copied or moved in addition to the memory cells addressed by the write command due to the non alignment of the write command address with respect to the flash (page or block) address, due to the difference in size of the smallest writeable or erasable unit between the hard drive and SSD. The reduction in overhead can be based at least partially on the lack of a need to move partially written pages to write a new data string on a page because formatting the memory array will cause data to be written to the beginning of an empty, e.g., erased, page.

Also, logical and/or physical blocks and/or pages can be used more efficiently when memory arrays are formatted. A format that aligns allocation units and system data to logical page boundaries and/or logical block boundaries, e.g., erase block, can cause the logical address of host write commands to coincide with the boundaries of the physical blocks or pages. Formatting can cause data to be written to the beginning of an empty, e.g., erased, physical block, e.g., at the boundary of the physical block. The data in physical blocks and/or pages can be erased and rewritten less often in a formatted memory array because the logical address of the host write command will start at the beginning of the logical and/or physical page and/or block, which does not require moving or copying those sectors in the page and/or physical block that precedes the logical address indicated in the write command as in the case of an unaligned format.

In one or more embodiments, formatting a memory array can complement wear leveling that can be implemented to control the wear rate on the memory arrays (e.g. 130-1 . . . 130-N in FIG. 1). As one of ordinary skill in the art will appreciate, wear leveling can increase the life of a solid state memory array since a solid state memory array can experience failure after a number of program and/or erase cycles.

In various embodiments, wear leveling can include dynamic wear leveling to minimize the amount of valid blocks moved to reclaim a block. Dynamic wear leveling can include a technique called garbage collection in which blocks with a number of invalid pages (i.e., pages with data that has been re-written to a different page and/or is no longer needed on the invalid pages) are reclaimed by erasing the block. Static wear leveling includes writing static data to blocks that have high erase counts to prolong the life of the block.

In one or more embodiments, a number of blocks can be designated as spare blocks to reduce the amount of write amplification associated with writing data in the memory array. A spare block can be a block in a memory array that can be designated as a block where data can not be written. Write amplification is a process that occurs when writing data to solid state memory arrays. When randomly writing data in a memory array, the memory array scans for free space in the array. Free space in a memory array can be individual cells, pages, and/or blocks of memory cells that are not programmed. If there is enough free space to write the data, then the data is written to the free space in the memory array. If there is not enough free space in one location, the data in the memory array is rearranged by erasing, moving, and rewriting the data that is already present in the memory array to a new location leaving free space for the new data that is to be written in the memory array. The rearranging of old data in the memory array can be called write amplification because the amount of writing the memory arrays has to do in order to write new data is amplified based upon the amount of free space in the memory array and the size of the new data that is to be written on the memory array. Write amplification can be reduced by increasing the amount of space on a memory array that is designated as free space (i.e., where static data will not be written), thus allowing for less amplification of the amount of data that has to be written because less data will have to be rearranged.

In one or more embodiments, formatting a memory array can be used to reduce the amount of write amplification and also reduce the amount of designated free space needed to control write amplification to desired levels. Formatted memory arrays are filled with data in an efficient manner, starting at the boundaries of physical block and pages, therefore a data string in a formatted memory array will not start in the middle of a physical block and/or page, thus decreasing the chance that the data string will need to be rewritten to another location to free up space in the memory array for new data.

Figure 4:
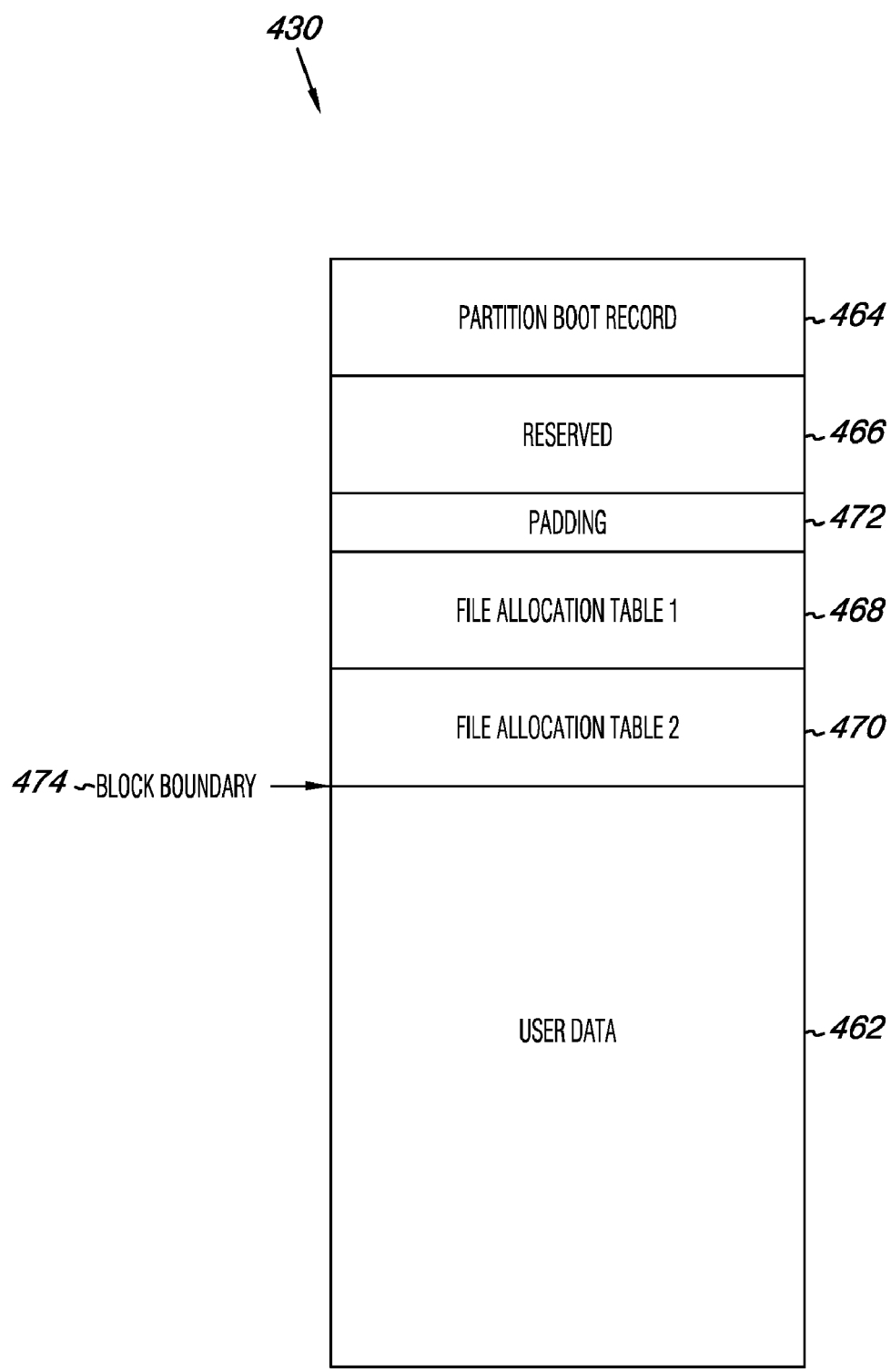
FIG. 4 illustrates a diagram of a file system for a number of memory arrays having user data aligned at a block boundary in accordance with one or more embodiments of the present disclosure.

FIG. 4 illustrates a diagram of a file system for a number of memory arrays 430 having user data aligned at a block boundary in accordance with one or more embodiments of the present disclosure. In FIG. 4, the file system for a number of memory arrays 430 includes a partition boot record 464, reserved data 466, a first file allocation table 468 (FILE ALLOCATION TABLE 1), and a second file allocation table 470 (FILE ALLOCATION TABLE 2). In the embodiment illustrated in FIG. 4, the reserved portion 466 and first file allocation table 468 are separated by padding 472. Padding 472 can be a number of memory cells that are not used to store system data or user data, e.g., the cells of padding 472 can remain in an erased state. The padding 472 can be located within memory arrays 430 such that the second file allocation table 470 ends at a block boundary, e.g., 474. Also, the padding 472 can be located within memory arrays 430 such that user data 462 starts at a block boundary, e.g., 474. The user data 462 can be aligned with a block boundary and the user data can be started at a physical block boundary in the memory arrays 430.

In one or more embodiments, the system data and the user data that is written to the solid state drive can be aligned with the physical structure of the solid state drive. That is, data is written at the beginning of a physical block when writing to an erased block and data is written at the beginning of a page when writing to an erased page. Also, in some embodiments, data will not be written to a partially written page and the data will be written to the next available erased page.

In one or more embodiments, various physical parameters associated with the memory arrays in a solid state drive can be stored in memory, such as random access memory (RAM), among other memory types, on the solid state drive and can be communicated to control circuitry in the solid state drive via the memory on the solid state drive. In one or more embodiments, the various physical parameters can be communicated from a host device, which received the physical parameters from the memory on the solid state drive. The physical parameters can include memory array size, page size, block size, file system type, media type and memory cell type, among other parameters.

In one or more embodiments, once the physical parameters are known by the control circuitry or by the host device, a modulus for writing data to the memory arrays can be calculated by the control circuitry or the host device. The modulus can be the minimum incremental number of memory cells used when writing data. The modulus can be calculated based on the total number of memory cells, the block size, the page size, and the memory cell type of the memory arrays.

In one or more embodiments, each portion of the solid state drive can be aligned with the physical parameters of the solid state drive. In various embodiments, padding, e.g., padding 472, can be provided in between each portion of data on the solid state drive. The padding can be a number of cells that remain unused, e.g., cells left in an erased state and are not used to write data. In some embodiments, padding can be provided between reserved data and the file allocation table of the solid state drive. For instance, in the embodiment illustrated in FIG. 4, padding 472 is provided between reserved data 466 and file allocation table 468. Padding can be located such that the file allocation tables end at a block boundary, e.g., 474, thus aligning the start of the user data to the beginning of the block following the block boundary where the file allocation table ends.

In one or more embodiments, padding can be provided between the reserved data and the first file allocation table causing the start of the first file allocation table to be aligned with a block boundary. In various embodiments, padding can be provided between the first file allocation table and the second file allocation table causing the second file allocation table to be aligned with a block boundary. In various embodiments, padding can be provided between the second file allocation table and the user data causing the user data to be aligned with a block boundary. In one or more embodiments, padding can be used, e.g., located, in various other locations within the memory arrays such that a portion of data on the solid state drive aligns with a block boundary.

Figure 5:
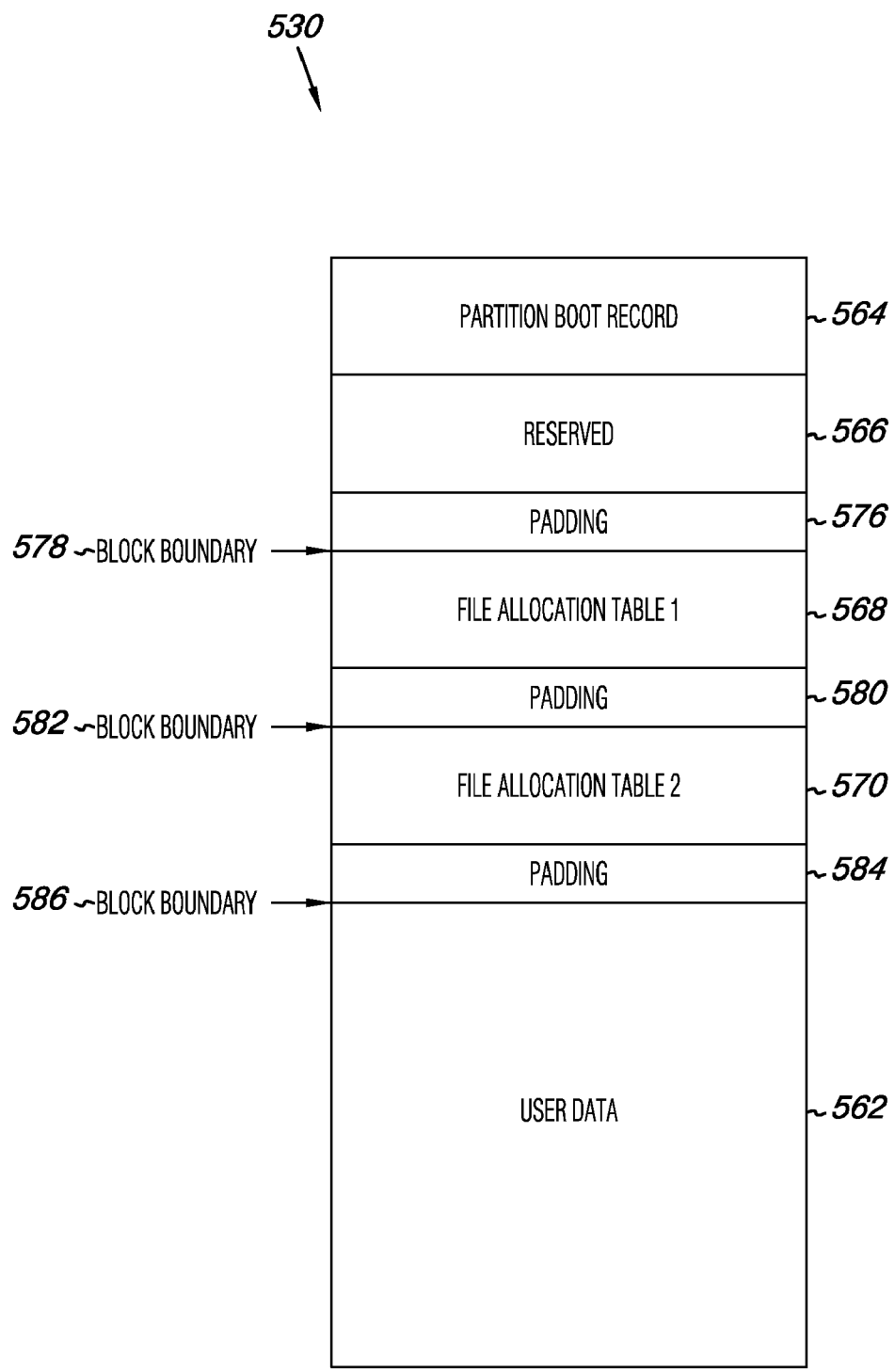
FIG. 5 illustrates a diagram of a file system for a number of memory arrays with the file allocation tables and user data aligned at a block boundary in accordance with one or more embodiments of the present disclosure.

FIG. 5 illustrates a diagram of a file system for a number of memory arrays 530 with the file allocation tables and user data aligned at a block boundary that can be operated in accordance with one or more embodiments of the present disclosure. In FIG. 5 the file system for a number of memory arrays 530 has a partition boot record 564, reserved data 566, a first file allocation table 568 (FILE ALLOCATION TABLE 1), and a second file allocation table 570 (FILE ALLOCATION TABLE 2). The reserved data 566 and the first file allocation table 568 are separated by padding 576. Padding 576 can be padding such as padding 472 described in connection with FIG. 4. For instance, padding 576 can be a number of memory cells that are not used to store data, e.g., data is not written to or read from the cells. The memory cells that are part of padding 576 end at block boundary 578 such that the first file allocation table 568 starts at a block boundary 578. The file allocation data that is written in the first file allocation table 568 can be aligned with the beginning of the block following boundary 578, as illustrated in FIG. 5.

In FIG. 5, the first file allocation table 568 and the second file allocation table 570 are separated by padding 580. The memory cells that are part of padding 580 end at block boundary 582 such that the second file allocation table 570 starts at block boundary 582.

In FIG. 5, the second file allocation table 570 and the user data 562 are separated by padding 584. The memory cells that are part of padding 584 are located such that user data 562 starts at block boundary 586. The user data 562 can be aligned with a block boundary and the user data can be started at a physical block boundary in the memory arrays 530.

Conclusion

The present disclosure includes methods and devices for solid state drive formatting. One device embodiment includes control circuitry coupled to a number of memory arrays, wherein each memory array has multiple physical blocks of memory cells. The memory arrays are formatted by the control circuitry that is configured to write system data to the number of memory arrays, where the system data ends at a physical block boundary; and write user data to the number of memory arrays, where the user data starts at a physical block boundary.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory controller, comprising: control circuitry coupled to a number of memory arrays, wherein each memory array has multiple physical blocks of memory cells and wherein the control circuitry formats each memory array by:
    writing system data to the number of memory arrays, where the system data ends at a physical block boundary of a first block, by including a padding of memory cells that do not contain data so that the system data ends at the physical block boundary of the first block; and
    writing user data to the number of memory arrays, where the user data starts at a physical block boundary of a second block, wherein the first block is a different block than the second block.

2. The memory controller of claim 1, wherein the number of memory arrays include a portion for system data and a portion for user data.

3. The memory controller of claim 1, wherein the padding of memory separates a first portion of the system data from a second portion of the system data such that the system data ends at the physical block boundary of the first block.

4. The memory controller of claim 1, wherein an indication of one or more physical parameters of the number of memory arrays is stored in memory in the control circuitry.

5. The memory controller of claim 4, wherein the one or more physical parameters of the number of memory arrays include array size, page size, block size, and memory cell type.

6. The memory controller of claim 1, wherein the control circuitry formats each memory array by writing the system data so that the system data includes a file allocation table that ends at the physical block boundary of the first block.

7. The memory controller of claim 1, wherein the control circuitry formats each memory array by writing the system data so that the system data includes reserved data and a file allocation table and so that a padding of erased memory cells between reserved data and the file allocation table causes the file allocation table to end at the physical block boundary of the first block.

8. The memory controller of claim 1, wherein the control circuitry formats each memory array by writing the system data so that the system data includes a first file allocation table and a second file allocation table and so that a padding of erased memory cells is between the first file allocation table and the second file allocation table.

9. The memory controller of claim 1, wherein the system data includes a partition boot record, reserved data, a first file allocation table, and a second file allocation table.

10. The memory controller of claim 1, wherein the control circuitry formats each memory array by writing the system data so that the system data includes reserved data, a first file allocation table, and a second file allocation table and so that a padding of erased memory cells between reserved data and the first file allocation table causes the second file allocation table to end at the physical block boundary of the first block.

11. The memory controller of claim 1, wherein the control circuitry formats each memory array by writing user data starting at the physical block boundary based of the second block, at least partially, on one or more physical parameters of the particular memory array and a modulus for writing to the particular memory array.

* * * * *

UNITED STATES PATENT AND TRADEMARK OFFICE
CERTIFICATE OF CORRECTION

PATENT NO.        : 8,392,687 B2
APPLICATION NO.   : 12/356725
DATED             : March 5, 2013
INVENTOR(S)       : Mehdi Asnaashari et al.

It is certified that error appears in the above-identified patent and that said Letters Patent is hereby corrected as shown below:

In the Claims:

In column 10, line 56, in Claim 3, after "memory" insert -- cells --.

Signed and Sealed this
Thirtieth Day of April, 2013

Teresa Stanek Rea
*Acting Director of the United States Patent and Trademark Office*